United States Patent
Khemka et al.

(10) Patent No.: US 6,882,023 B2
(45) Date of Patent: Apr. 19, 2005

(54) FLOATING RESURF LDMOSFET AND METHOD OF MANUFACTURING SAME

(75) Inventors: Vishnu Khemka, Mesa, AZ (US); Vijay Parthasarathy, Phoenix, AZ (US); Ronghua Zhu, Chandler, AZ (US); Amitava Bose, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/286,169

(22) Filed: Oct. 31, 2002

(65) Prior Publication Data

US 2004/0084744 A1 May 6, 2004

(51) Int. Cl.$^7$ .............................................. H01L 21/336
(52) U.S. Cl. ........................ 257/493; 257/328; 257/335
(58) Field of Search ......................... 257/328, 335–343, 257/491–493

(56) References Cited

U.S. PATENT DOCUMENTS 5,146,298 A   9/1992   Eklund

FOREIGN PATENT DOCUMENTS

| EP | 1 309 011 A2 | 7/2003 |
|---|---|---|
| WO | WO 97/29518 | 8/1997 |

OTHER PUBLICATIONS

Zhu, et al., "Implementation of High–Side, High–Voltage RESURF LDMOS in a sub–half Micron Smart Power Technology," 2001 Int'l Symposium on Power Semiconductor Devices and ICs, Osaka, Japan, pp. 403–406.

Vishnu Khemka, et al., "Experimental and Theoretical Analysis of Energy Capability of RESURF LDMOSFETs and Its Correlation With Static Electrical Safe Operating Area (SOA)," *IEEE Transactions on Electron Devices*, vol. 49, No. 6, Jun. 2002.

R. Zhu, et al., "Implementation of High–Side, High–Voltage RESURF LDMOS in a sub–half Micron Smart Power Technology," *Proceedings of the ISPSD*, Jun. 2001.

*Primary Examiner*—Hoai Pham
*Assistant Examiner*—Marcos D. Pizarro-Crespo
(74) *Attorney, Agent, or Firm*—Bryan Cave LLP

(57) ABSTRACT

A semiconductor component includes a RESURF transistor (100, 200, 300, 400, 500) that includes a first semiconductor region (110, 210, 310, 410, 510) having a first conductivity type and an electrically-floating semiconductor region (115, 215, 315, 415, 515, 545) having a second conductivity type located above the first semiconductor region. The RESURF transistor further includes a second semiconductor region (120, 220, 320, 420, 520) having the first conductivity type located above the electrically-floating semiconductor region, a third semiconductor region (130, 230) having the first conductivity type located above the second semiconductor region, and a fourth semiconductor region (140, 240, 340, 440, 540) having the second conductivity type located above the second semiconductor region. In a particular embodiment, the fourth semiconductor region and the electrically-floating semiconductor region deplete the second semiconductor region when a reverse bias is applied between the third semiconductor region and the fourth semiconductor region.

22 Claims, 3 Drawing Sheets

FLOATING RESURF LDMOSFET AND METHOD OF MANUFACTURING SAME

FIELD OF THE INVENTION

This invention relates generally to semiconductor components, and relates more particularly to field effect transistors and methods of manufacture.

BACKGROUND OF THE INVENTION

Power devices are electronic components designed to be tolerant of the high currents and voltages that are present in power applications such as motion control, air bag deployment, and automotive fuel injector drivers. The power lateral double-diffused metal-oxide-semiconductor (LDMOS) field-effect-transistor (FET) device, referred to herein as a power LDMOS device, is becoming increasingly popular for power applications. As power technologies develop, power applications require smaller and smaller power LDMOS devices. Power LDMOS devices in deep sub-micrometer (sub-micron) technologies are difficult to design, however, in part due to limited epitaxial layer thickness and limited thermal budget. Furthermore, power LDMOS devices must be designed to operate in a "high-side configuration," which is a configuration in which all the device terminals are level shifted with respect to the substrate potential. A device that may be operated in a high-side configuration is said to be "high-side capable." High-side capable power LDMOS devices are designed to prevent a direct punch-through path from a body region of the power LDMOS device to an underlying, heavily doped substrate. Limited epitaxial layer thicknesses make this high-side capability problematic as well because the punch-through problem becomes worse as the epitaxial layer thickness decreases.

Existing technology attempts to satisfy the high breakdown voltage requirement by utilizing a power LDMOS device having a reduced surface field (RESURF) structure. A power LDMOS device having a RESURF structure comprises a first semiconductor region, which serves as a RESURF region, having one conductivity type and a second semiconductor region, which serves as a drift region, having a different conductivity type. The RESURF region depletes the drift region, thus reducing the electric field in the drift region and allowing a higher breakdown voltage for the power LDMOS device. The RESURF structure just described is referred to herein as a "single RESURF" structure.

A "double RESURF" structure, on the other hand, comprises first and third semiconductor regions, which serve as dual RESURF regions, having one conductivity type and a second semiconductor region, which serves as a drift region, having a different conductivity type. In the double RESURF structure, each of the dual RESURF regions deplete the drift region, thus reducing the electric field in the drift region to a greater degree than is possible with a single RESURF structure. A transistor, including power LDMOS devices and bipolar transistors, having a single or double RESURF structure, will be referred to herein as a "RESURF transistor."

Typical RESURF transistors have a low punch-through voltage between the body region and the heavily doped substrate and hence are not high-side capable. Attempts to increase the punch-through voltage have introduced further problems. For example, ion implanted regions electrically shorted to the drain or source terminals have been formed below the body region to reduce the punch-through problem, but such regions negatively impact breakdown voltage and specific on-resistance ($R_{dson}$). For example, increasing N-type doping in the ion implanted regions under a P-type body region in order to absorb more of the electric field in the P-type body region reduces breakdown voltage and increases $R_{dson}$. Therefore, a need exists for a RESURF transistor that achieves high breakdown voltage without introducing additional process complexity or negatively impacting $R_{dson}$.

BRIEF DESCRIPTION OF THE DRAWINGS

The invention will be better understood from a reading of the following detailed description, taken in conjunction with the accompanying figures in the drawings in which.

Figure 1:
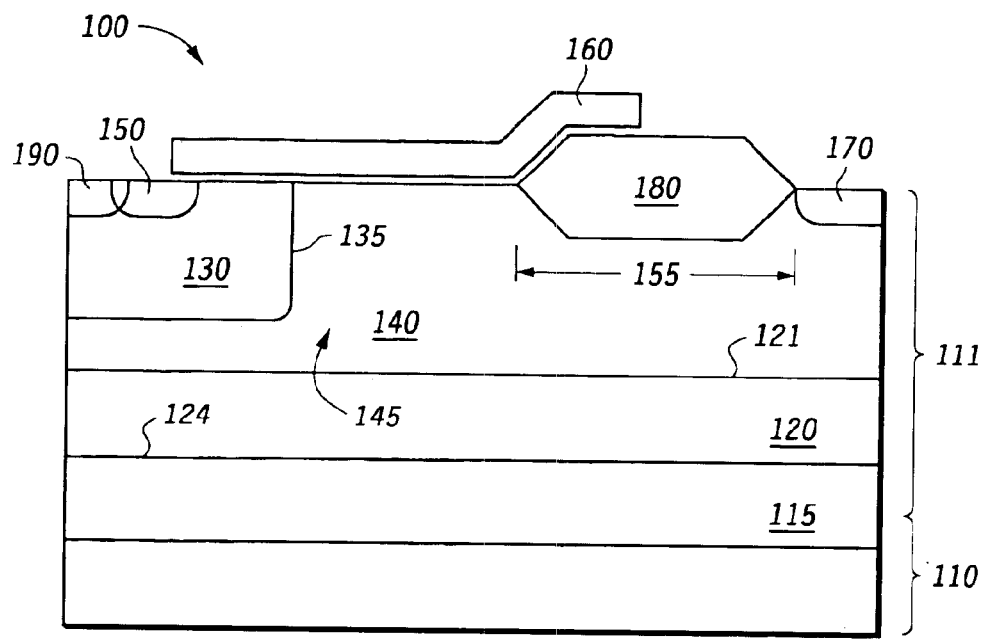
FIG. 1 is a cross-sectional view of a portion of a transistor according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," ""over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a semiconductor component comprises a RESURF transistor that includes a first semiconductor region having a first conductivity type and an electrically-floating semiconductor region having a second conductivity type located above the first semiconductor region. The RESURF transistor further includes a second semiconductor region having the first conductivity type located above the electrically-floating semiconductor region, a third semiconductor region having the first conductivity type located above the second semiconductor region, and a fourth semiconductor region having the second conductivity type located above the second semiconductor region. In a particular embodiment, the fourth semiconductor region and the electrically-floating semiconductor region deplete the second semiconductor region when a reverse bias is applied between the third semiconductor region and the fourth semiconductor region.

Referring now to FIG. 1, which is a cross-sectional view of a portion of a transistor according to an embodiment of the invention, a RESURF transistor 100 is a portion of a semiconductor component. As an example, the semiconductor component can be a discrete component or an integrated circuit.

RESURF transistor 100 comprises a semiconductor region or semiconductor substrate 110, a semiconductor epitaxial layer 111 above semiconductor substrate 110, an electrically-floating semiconductor region 115 located in semiconductor substrate 110 and semiconductor epitaxial layer 111, a semiconductor region 120 located in semiconductor epitaxial layer 111 and above electrically-floating semiconductor region 115, a semiconductor region 130 located in semiconductor epitaxial layer 111 and above semiconductor region 120, and a semiconductor region 140 located in semiconductor epitaxial layer 111 and above semiconductor region 120. Semiconductor substrate 110, semiconductor region 120, and semiconductor region 130 have a first conductivity type. Electrically-floating semiconductor region 115 and semiconductor region 140 have a second conductivity type. As an example of a particular embodiment of RESURF transistor 100, semiconductor substrate 110 comprises a P-type semiconductor substrate, semiconductor epitaxial layer 111 comprises a P-type epitaxial layer, electrically-floating semiconductor region 115 comprises a heavily-doped N-type buried layer, semiconductor region 120 can comprise an original portion of the P-Type semiconductor epitaxial layer 111, semiconductor region 130 comprises a P-type body region, and semiconductor region 140 comprises an N-type drift region.

Electrically-floating semiconductor region 115 is under an active area 145 of RESURF transistor 100. Active area 145 comprises portions of semiconductor region 130 and semiconductor region 140. In the embodiment illustrated in FIG. 1, electrically-floating semiconductor region 115 is continuous under all of active area 145 of RESURF transistor 100. The introduction of electrically-floating semiconductor region 115 prevents direct punch-through from semiconductor region 130 to semiconductor substrate 110, thus making RESURF transistor 100 high-side capable.

Semiconductor region 140 and electrically-floating semiconductor region 115 deplete semiconductor region 120 when a reverse bias is applied between semiconductor region 130 and semiconductor region 140. The fact that both electrically-floating semiconductor region 115 and semiconductor region 140 deplete semiconductor region 120 means that RESURF transistor 100 has a double RESURF structure. A RESURF transistor, including RESURF transistor 100, comprising an electrically-floating semiconductor region, such as electrically-floating semiconductor region 115, may be referred to herein as a Floating RESURF (FRESURF) transistor.

RESURF transistor 100 further comprises a source region 150, a gate electrode 160, and a drain region 170. RESURF transistor 100 still further comprises an oxide region 180 and a body contact region 190. Semiconductor region 130 can be referred to as a body region, and semiconductor region 140 can be referred to as a drift region. RESURF transistor 100 also comprises a drift length 155, a junction 121 between semiconductor region 140 and semiconductor region 120, a junction 124 between electrically-floating semiconductor region 115 and semiconductor region 120, and a junction 135 between semiconductor region 130 and semiconductor region 140. Source region 150 and drain region 170 have the second conductivity type, and body contact region 190 has the first conductivity type.

The reverse bias breakdown voltage of RESURF transistor 100 is governed by the reverse bias breakdown potential between the various regions within RESURF transistor 100. More specifically, when a voltage is applied to a first region having a first conductivity type and a different voltage is applied to a second region having a second conductivity type, a voltage difference is set up between the two regions. The voltage difference is often referred to as a potential difference. A reverse bias breakdown potential is the lowest potential difference that will cause breakdown, meaning the lowest potential difference that will cause a current to flow between the two regions, which are reverse biased. A device may cease to function, and may be destroyed, when a reverse bias breakdown potential exists between two regions, one of which is externally connected. For RESURF transistor 100, the regions that are externally connected are semiconductor region 130 and semiconductor region 140, through body contact region 190 and drain region 170, respectively.

If one of the two regions between which a reverse bias breakdown potential exists is grounded, the reverse bias breakdown voltage of the device equals the reverse bias breakdown potential. As an example, one P-type region of a device may be grounded, meaning the voltage it is exposed to is fixed at zero volts. An N-type region may be biased at, for example, 20 volts so that the potential difference between the two regions is 20 volts. Suppose that this 20-volt potential difference is the lowest potential difference that will cause a reverse bias current to flow between the regions. The 20-volt potential difference then becomes the breakdown potential between the regions. Finally, the reverse bias breakdown voltage would also be twenty volts because that would be, in this example, the lowest voltage that could be placed on the non-grounded N-type region that would cause the reverse bias breakdown of the device.

Accordingly, the drain-to-source reverse bias breakdown voltage for RESURF transistor 100 in FIG. 1 can be governed by the reverse bias breakdown voltage at junction 121 (i.e., between semiconductor regions 120 and 140), at junction 135 (i.e., between semiconductor regions 130 and 140), or at junction 124 (i.e., between semiconductor regions 115 and 120). In one embodiment, the drain-to-source reverse bias breakdown voltage for RESURF transistor 100 is determined by the reverse bias breakdown voltage at junction 135. Therefore, the reverse bias breakdown at junction 121 is somehow not reached or achieved before the reverse bias breakdown at junction 135. To increase the drain-to-source breakdown voltage of the RESURF transistor 100, drift length 155 can be increased by, for example, increasing the size of oxide region 180.

Semiconductor region 140 of RESURF transistor 100 is depleted in a two-dimensional manner by semiconductor region 130 and semiconductor region 120. In one embodiment, semiconductor region 140 is fully depleted and the drain-to-source breakdown voltage of RESURF transistor 100 is achieved by the breakdown of junction 121 before the breakdown of junction 135 reaches its breakdown. It will be understood by one of ordinary skill in the art that this does not necessarily indicate that the breakdown voltage of junction 135 is higher than that of junction 121. Rather, when the potential applied to drain region 170 is increased, the electric field at junction 135 does not increase high enough for it to reach breakdown, and the drain-to-source breakdown is controlled by the maximum voltage sustained by junction 121.

Increasing the doping concentration of semiconductor region 120 may cause semiconductor region 140 to deplete at a rate resulting in a drop in the drain-to-source breakdown voltage. On the other hand, decreasing the doping concentration of semiconductor region 120 may result in the failure of semiconductor region 120 to optimally deplete semiconductor region 140, resulting in a decrease in drain-to-source voltage.

Increasing the doping concentration of semiconductor region 120 will also produce two other effects. First, the $R_{dson}$ for RESURF transistor 100 is increased, and second, the punch-through voltage for semiconductor region 120 is also increased. The increase of $R_{dson}$ is detrimental to the electrical performance of RESURF transistor 100. The punch-through voltage for semiconductor region 120 is explained in more detail in the immediately following paragraphs.

Semiconductor region 120 has a thickness, and junction 121 has a reverse bias breakdown depletion width in semiconductor region 120. If drain region 170 and semiconductor regions 130 and 120 are each biased at the same voltage or potential or are each electrically floating, then semiconductor region 140 will deplete a portion of semiconductor region 120 from junction 121, and electrically-floating semiconductor region 115 will deplete a portion of semiconductor region 120 from junction 124. When drain region 170 is biased at a voltage or potential that is higher than the potential or potentials at which semiconductor regions 130 and 120 are biased (i.e., junction 121 is reverse biased), semiconductor region 140 will deplete a larger portion of semiconductor region 120 from junction 121.

If drain region 170 is biased at a high enough potential relative to the potential(s) for semiconductor regions 130 and 120 (i.e., junction 121 is highly reversed biased), the two depletion regions from junctions 121 and 124 will meet or merge within semiconductor region 120. Under this condition, semiconductor region 120 is fully depleted in at least a region under drain region 170. The potential or voltage for drain region 170 that will cause this fully depleted condition to occur is referred to as the "punch-through voltage." For the remainder of the explanation for the punch-through voltage, it will be assumed that semiconductor regions 130 and 120 and source region 150 are each biased at a ground potential or zero volts.

When the punch-through voltage is reached, electrically-floating semiconductor region 115 becomes electrically coupled to semiconductor region 140 because semiconductor region 120 is fully depleted. Consequently, if a voltage greater than the punch-through voltage is applied to drain region 170 of RESURF transistor 100, electrically floating semiconductor region 115 is no longer electrically floating, and a potential of electrically-floating semiconductor region 115 is offset from a potential of drain region 170 by a fixed offset potential approximately equal to the punch-through voltage.

If the reverse bias breakdown voltage for junction 121 is less than the punch-through voltage for semiconductor region 120, then the electrical coupling of electrically-floating semiconductor region 115 to semiconductor region 140 will not occur. If, however, the reverse bias breakdown voltage for junction 121 is greater than the punch-through voltage for semiconductor region 120, then the electrical coupling of electrically-floating semiconductor region 115 to semiconductor region 140 will occur, and the breakdown of junction 121 will not occur. To ensure that the punch-through voltage is less than the reverse bias breakdown voltage, the thickness of semiconductor region 120 can be reduced to a predetermined thickness at which the two aforementioned depletion regions merge within semiconductor region 120 before junction 121 breaks down. When semiconductor region 120 has this predetermined thickness, junction 121 will not break down. Accordingly, the predetermined thickness of semiconductor region 120 is less than a reverse bias breakdown voltage depletion width within semiconductor region 120.

The doping concentration of semiconductor region 120 and the drift length 155 can be independently increased to increase the drain-to-source breakdown voltage, while the thickness of semiconductor region 120 is chosen, as explained hereinabove, to ensure that the punch-through voltage for semiconductor region 120 remains less than the reverse bias breakdown voltage at junction 121. With semiconductor region 120 having the predetermined thickness, the drain-to-source reverse bias breakdown voltage for RESURF transistor 100 is defined by a sum of a breakdown potential between semiconductor region 120 and electrically floating semiconductor region 115, (i.e., the breakdown potential of junction 124), and the offset potential. If electrically-floating semiconductor region 115 had not been electrically floating but had instead been electrically biased, for example to the drain region 170, the drain-to-source reverse bias breakdown voltage would have been the breakdown voltage of junction 124, and would not have been increased by the value of the offset potential. RESURF transistor 100 can thus have a very high drain-to-source reverse bias breakdown voltage, which makes RESURF transistor 100 suitable for high voltage and high power applications.

In an embodiment of RESURF transistor 100 having these characteristics, semiconductor region 140 can have a thickness of approximately 1.0 micrometer (micron) and an N-type charge density of approximately $2.4 \times 10^{12}$ atoms per $cm^2$; semiconductor region 120 can have a thickness of approximately 1.0 micron and a P-type charge density of approximately $2.4 \times 10^{12}$ atoms per $cm^2$; electrically-floating semiconductor region 115 can have a thickness of approximately 2.0 microns and an N-type doping concentration of approximately $1.0 \times 10^{19}$ atoms per $cm^3$; and drift length 155 can have a length of approximately 2.5 microns. In this embodiment, the offset potential (i.e., the punch-through voltage) is approximately 35 volts and the breakdown voltage of junction 124 is approximately 55 volts. Hence, in this embodiment, RESURF transistor 100 can have a drain-to-source reverse bias breakdown voltage of approximately ninety volts. By comparison, the breakdown voltage would have only been 55 volts if electrically-floating semiconductor region 115 had not been electrically floating but had instead been electrically coupled to drain region 170. This increased drain-to-source breakdown voltage of RESURF transistor 100 may be realized without any penalty in terms of cost, size, epitaxial layer thickness, process complexity, or $R_{dson}$ for RESURF transistor 100.

Figure 2:
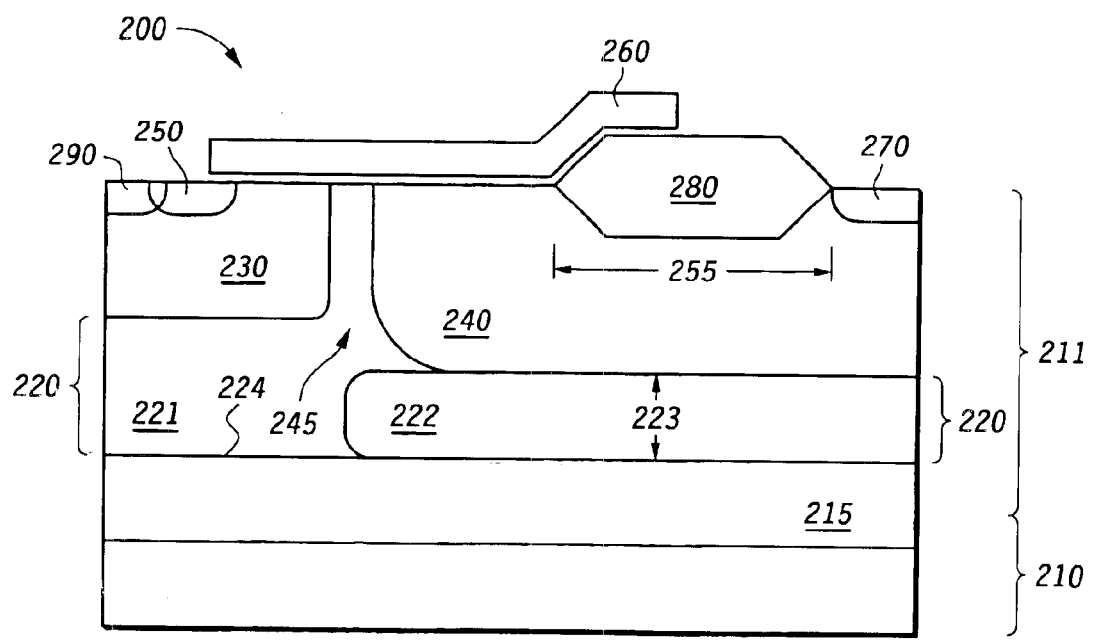
FIG. 2 is a cross-sectional view of a portion of a transistor according to another embodiment of the invention.

Referring now to FIG. 2, which is a cross-sectional view of a portion of a transistor according to another embodiment of the invention, a RESURF transistor 200 is a portion of a semiconductor component, which can be a discrete component or an integrated circuit. RESURF transistor 200 comprises a semiconductor region or semiconductor substrate 210, a semiconductor epitaxial layer 211 above semiconductor substrate 210, an electrically-floating semiconductor region 215 located in semiconductor substrate 210 and semiconductor epitaxial layer 211, a semiconductor region 220 located in semiconductor epitaxial layer 211 and above electrically-floating semiconductor region 215, a semiconductor region 230 located in semiconductor epitaxial layer 211 and above semiconductor region 220, and a semiconductor region 240 located in semiconductor epitaxial layer 211 and above semiconductor region 220. Electrically-floating semiconductor region 215 is under an active area 245 of RESURF transistor 200. Active area 245 comprises portions of semiconductor region 230 and semiconductor region 240. In the embodiment illustrated in FIG. 2, electrically-floating semiconductor region 215 is continuous under all of active area 245 of RESURF transistor 200. Semiconductor region 220 comprises a first portion 221, at least a substantial part of which is located under semiconductor region 230, and a second portion 222, at least a substantial part of which is located under semiconductor region 240. In one embodiment, first portion 221 is defined by the formation of semiconductor region 230 and semiconductor region 240 and by the doping concentrations within semiconductor region 220.

RESURF transistor 200 further comprises a source region 250, a gate electrode 260, and a drain region 270. RESURF transistor 200 still further comprises an oxide region 280 and a body contact region 290. Semiconductor region 230 can be referred to as a body region, and semiconductor region 240 can be referred to as a drift region. RESURF transistor 200 has a drift length 255.

Semiconductor substrate 210, semiconductor region 220, semiconductor region 230, and body contact region 290 have a first conductivity type. Electrically-floating semiconductor region 215, semiconductor region 240, source region 250, and drain region 270 have a second conductivity type. Semiconductor region 240 and electrically-floating semiconductor region 215 deplete second portion 222 of semiconductor region 220 when a reverse bias is applied between semiconductor region 230 and semiconductor region 240 via body contact region 290 and drain region 270, respectively. The fact that both electrically-floating semiconductor region 215 and semiconductor region 240 deplete second portion 222 of semiconductor region 220 means that RESURF transistor 200 has a double RESURF structure.

In a particular embodiment of RESURF transistor 200, semiconductor substrate 210 comprises a P-type semiconductor substrate, semiconductor epitaxial layer 211 comprises a P-type epitaxial layer, electrically-floating semiconductor region 215 comprises a heavily-doped N-type buried layer, semiconductor region 220 comprises a P-type semiconductor region, semiconductor region 230 comprises a P-type body region, and semiconductor region 240 comprises an N-type drift region. First portion 221 can be an original portion of semiconductor epitaxial layer 211. Second portion 222 can comprise a P-type well in semiconductor epitaxial layer 211. In one embodiment, a doping concentration of first portion 221 is less than a doping concentration of second portion 222. The lower doping concentration of first portion 221 increases the breakdown voltage for a junction 224 between semiconductor region 220 and electrically-floating semiconductor region 215, while the higher doping concentration of second portion 222 provides a higher punch-through voltage for semiconductor region 220.

RESURF transistor 200 functions in a manner similar to that described earlier for RESURF transistor 100 in FIG. 1. In one embodiment, a thickness 223 of second portion 222 has a predetermined value such that it is less than a depletion width in second portion 222 at an onset of reverse bias breakdown between semiconductor region 240 and second portion 222. In this embodiment, electrically-floating semiconductor region 215 is electrically coupled to semiconductor region 240 after second portion 222 of semiconductor region 220 is fully depleted in at least a region directly under drain region 270. In other words, after second portion 222 is fully depleted, electrically-floating semiconductor region 215 is no longer electrically floating, and a potential of electrically-floating semiconductor region 215 is offset from a potential of semiconductor region 240 by an offset potential. The offset potential is approximately equal to the punch-through voltage of semiconductor region 220.

If a voltage at drain region 270 is raised above a voltage at body contact region 290, the result will be a reverse bias across RESURF transistor 200. In an embodiment wherein a voltage at drain region 270 is raised above a voltage at body contact region 290, a drain-to-source reverse bias breakdown voltage for RESURF transistor 200 is a sum of a breakdown potential between first portion 221 of semiconductor region 220 and electrically-floating semiconductor region 215, or the breakdown potential of junction 224, and the offset potential.

Figure 3:
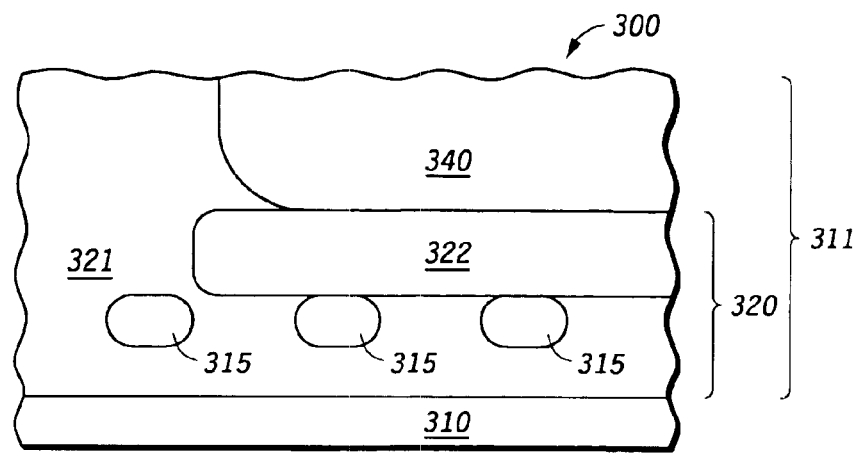
FIG. 3 is a cross-sectional view of a portion of a transistor according to yet another embodiment of the invention.

Referring now to FIG. 3, which is a cross-sectional view of a portion of a transistor according to another embodiment of the invention, a RESURF transistor 300 is a portion of a semiconductor component, which can be a discrete component or an integrated circuit. RESURF transistor 300 comprises a semiconductor substrate 310, a semiconductor epitaxial layer 311 above semiconductor substrate 310, a group of electrically-floating semiconductor regions 315 located in semiconductor epitaxial layer 311 and above semiconductor substrate 310, a semiconductor region 320 located in semiconductor epitaxial layer 311 and having at least a portion above at least one of the electrically-floating semiconductor regions 315, and a semiconductor region 340 located in semiconductor epitaxial layer 311 and above semiconductor region 320. Semiconductor region 320 comprises a first portion 321 and a second portion 322. As an example, semiconductor epitaxial layer 311 can be similar to semiconductor epitaxial layer 111 in FIG. 1 and semiconductor epitaxial layer 211 in FIG. 2. As another example, semiconductor substrate 310 can be similar to semiconductor substrate 110 in FIG. 1 and semiconductor substrate 210 in FIG. 2. As a further example, electrically-floating semiconductor regions 315 can be similar to electrically-floating semiconductor region 115 in FIG. 1 and electrically-floating semiconductor region 215 in FIG. 2. As another example, semiconductor region 320 can be similar to semiconductor region 120 in FIG. 1 and semiconductor region 220 in FIG. 2. As yet another example, first portion 321 and second portion 322 can be similar to first portion 221 and second portion 222, respectively, in FIG. 2. As a further example, semiconductor region 340 can be similar to semiconductor region 140 in FIG. 1 and semiconductor region 240 in FIG. 2.

Electrically-floating semiconductor regions 315 are under an active area of RESURF transistor 300. The active area comprises portions of semiconductor region 340. Semiconductor substrate 310 and semiconductor region 320 have a first conductivity type, and electrically-floating semiconductor regions 315 and semiconductor region 340 have a second conductivity type. In a particular embodiment, semiconductor substrate 310 is a P-type semiconductor substrate, semiconductor epitaxial layer 311 is a P-type epitaxial layer, first portion 321 is an original portion of semiconductor region 320, second portion 322 is a P-type region in semiconductor epitaxial layer 311, and electrically-floating semiconductor regions 315 and semiconductor region 340 are N-type semiconductor regions.

As was true for corresponding regions in RESURF transistor 100 (FIG. 1) and RESURF transistor 200 (FIG. 2), semiconductor region 340 and electrically-floating semiconductor regions 315 deplete second portion 322, meaning that RESURF transistor 300 has a double RESURF structure. In the embodiment illustrated in FIG. 3, each one of electrically-floating semiconductor regions 315 is electrically isolated from each other one of electrically-floating semiconductor regions 315, thus providing RESURF transistor 300 with multiple electrically isolated islands of electrically-floating semiconductor material. Electrically-floating semiconductor regions 315 are not continuous under all of the active area of RESURF transistor 300.

In the embodiment illustrated in FIG. 3, a first one of the group of electrically-floating semiconductor regions 315 is located side by side with a second one of the group of electrically-floating semiconductor regions 315 in a plane parallel to a top surface of semiconductor substrate 310. Instead of possessing a single punch-through voltage between semiconductor region 340 and electrically-floating semiconductor regions 315, RESURF transistor 300 may, in one embodiment, possess multiple punch-through voltages. As an example, a first punch-through voltage may exist between semiconductor region 340 and a first one of electrically-floating semiconductor regions 315. A second punch-through voltage may exist between the first one of electrically-floating semiconductor regions 315 and a second one of electrically-floating semiconductor regions 315. Different punch-through voltages may exist between other pairs of electrically-floating semiconductor regions 315. A particular one of electrically-floating semiconductor regions 315, at least a portion of which is in first portion 321 of semiconductor region 320, may be the last one of electrically-floating semiconductor regions 315 whose punch-through voltage is reached. An offset voltage between the particular one of electrically-floating semiconductor regions 315 and semiconductor region 340 equals a sum of all the punch-through voltages between different ones of the electrically-floating semiconductor regions 315 and the punch-through voltage between the first electrically-floating semiconductor region 315 and semiconductor region 340.

Figure 4:
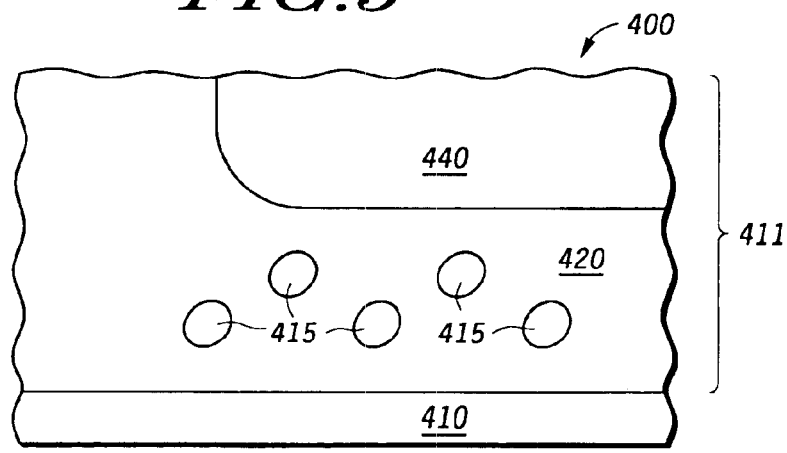
FIG. 4 is a cross-sectional view of a portion of a transistor according to a further embodiment of the invention.

Referring now to FIG. 4, which is a cross-sectional view of a portion of a transistor according to another embodiment of the invention, a RESURF transistor 400 is a portion of a semiconductor component, which can be a discrete component or an integrated circuit. RESURF transistor 400 comprises a semiconductor substrate 410, a semiconductor epitaxial layer 411 above semiconductor substrate 410, a group of electrically-floating semiconductor regions 415 located in semiconductor epitaxial layer 411 and above semiconductor substrate 410, a semiconductor region 420 located in semiconductor epitaxial layer 411 and having at least a portion above semiconductor substrate 410, and a semiconductor region 440 located in semiconductor epitaxial layer 411 and above semiconductor region 420. As an example, semiconductor substrate 410 can be similar to semiconductor substrate 110 in FIG. 1, semiconductor substrate 210 in FIG. 2, and semiconductor substrate 310 in FIG. 3. As another example, semiconductor epitaxial layer 411 can be similar to semiconductor epitaxial layer 111 in FIG. 1, semiconductor epitaxial layer 211 in FIG. 2, and semiconductor epitaxial layer 311 in FIG. 3. As a further example, electrically-floating semiconductor regions 415 can be similar to electrically-floating semiconductor region 115 in FIG. 1, electrically-floating semiconductor region 215 in FIG. 2, and electrically-floating semiconductor regions 315 in FIG. 3. As another example, semiconductor region 420 can be similar to semiconductor region 120 in FIG. 1, semiconductor region 220 in FIG. 2, and semiconductor region 320 in FIG. 3. As yet another example, semiconductor region 440 can be similar to semiconductor region 140 in FIG. 1, semiconductor region 240 in FIG. 2, and semiconductor region 340 in FIG. 3.

In the embodiment illustrated in FIG. 4, the electrically-floating semiconductor regions 415 are distributed throughout semiconductor region 420 and are located under an active area of RESURF transistor 400. The active area comprises portions of semiconductor region 440. Each one of electrically-floating semiconductor regions 415 is electrically isolated from each other one of electrically-floating semiconductor regions 415. The details regarding punch-through voltages, the active area, conductivity type, and RESURF operation for the embodiment of FIG. 4 are substantially similar to those described for the embodiment of FIG. 3. Electrically-floating semiconductor regions 415 are not continuous under all of the active area of RESURF transistor 400.

Figure 5:
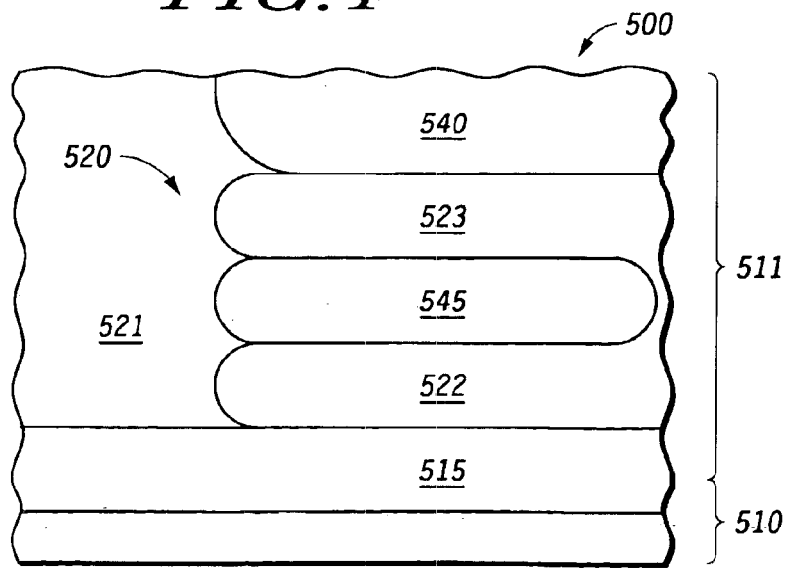
FIG. 5 is a cross-sectional view of a portion of a transistor according to another embodiment of the invention.

Referring now to FIG. 5, which is a cross-sectional view of a portion of a transistor according to another embodiment of the invention, a RESURF transistor 500 is a portion of a semiconductor component, which can be a discrete component or an integrated circuit. RESURF transistor 500 comprises a semiconductor substrate 510, a semiconductor epitaxial layer 511 above semiconductor substrate 510, an electrically-floating semiconductor region 515 located in semiconductor epitaxial layer 511 and above semiconductor substrate 510, a portion 521 of a semiconductor region 520 located in semiconductor epitaxial layer 511 and above electrically-floating semiconductor region 515, a portion 522 of semiconductor region 520 located in semiconductor epitaxial layer 511 and above electrically-floating semiconductor region 515, an electrically-floating semiconductor region 545 located in semiconductor epitaxial layer 511 and above portion 522, a portion 523 of semiconductor region 520 located in semiconductor epitaxial layer 511 and above electrically-floating semiconductor region 545, and a semiconductor region 540 located in semiconductor epitaxial layer 511 and above portion 523. As an example, semiconductor substrate 510 can be similar to semiconductor substrate 110 in FIG. 1, semiconductor substrate 210 in FIG. 2, semiconductor substrate 310 in FIG. 3, and semiconductor substrate 410 in FIG. 4. As another example, semiconductor epitaxial layer 511 can be similar to semiconductor epitaxial layer 111 of FIG. 1, semiconductor epitaxial layer 211 of FIG. 2, semiconductor epitaxial layer 311 of FIG. 3, and semiconductor epitaxial layer 411 of FIG. 4. As a further example, electrically-floating semiconductor regions 515 and 545 can be similar to electrically-floating semiconductor region 115 in FIG. 1, electrically-floating semiconductor region 215 in FIG. 2, electrically-floating semiconductor regions 315 in FIG. 3, and electrically-floating semiconductor regions 415 in FIG. 4. As another example, semiconductor region 520 can be similar to semiconductor region 120 in FIG. 1, semiconductor region 220 in FIG. 2, semiconductor region 320 in FIG. 3, and semiconductor region 420 in FIG. 4, while portion 521 can be similar to first portion 221 in FIG. 2 and first portion 321 in FIG. 3. As a further example, portions 522 and 523 can be similar to second portion 222 in FIG. 2 and second portion 322 in FIG. 3. As yet another example, semiconductor region 540 can be similar to semiconductor region 140 in FIG. 1, semiconductor region 240 in FIG. 2, semiconductor region 340 in FIG. 3, and semiconductor region 440 in FIG. 4.

Electrically-floating semiconductor region 515 and electrically-floating semiconductor region 545 are located under an active area of RESURF transistor 500. The active area comprises at least a portion of semiconductor region 540. Semiconductor substrate 510 and semiconductor region 520 have a first conductivity type. Electrically-floating semiconductor region 515, electrically-floating semiconductor region 545, and semiconductor region 540 have a second conductivity type. In one embodiment, semiconductor substrate 510 is a P-type semiconductor substrate, semiconductor epitaxial layer 511 is a P-type epitaxial layer, electrically-floating semiconductor region 515 is a heavily-doped N-type buried layer, electrically-floating semiconductor region 545 is an N-type semiconductor region, and semiconductor region 540 is an N-type drift region, while semiconductor region 520 comprises a P-type semiconductor region.

In the embodiment illustrated in FIG. 5, electrically-floating semiconductor region 545 comprises an electrically isolated island of electrically-floating semiconductor material. It will be understood by one of ordinary skill in the art that other embodiments of RESURF transistor 500 may comprise more than one electrically isolated island of electrically-floating semiconductor material, with the resulting group of electrically-floating semiconductor islands or regions being arranged vertically, one above another, in the manner illustrated in FIG. 5.

Figure 6:
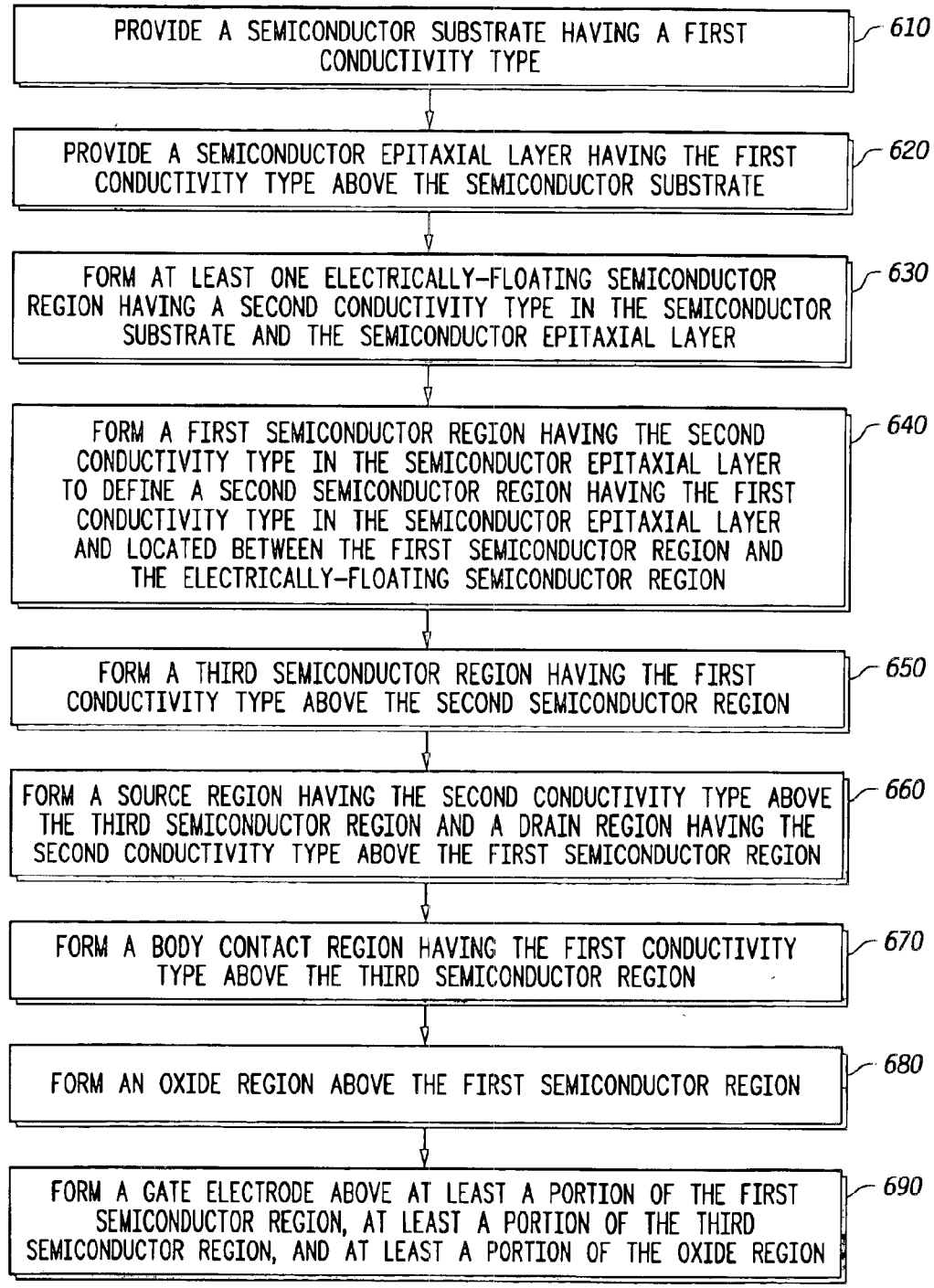
FIG. 6 is a flow diagram illustrating a method of manufacturing a semiconductor component according to an embodiment of the invention.

Refer now to FIG. 6, which is a flow diagram illustrating a method 600 of manufacturing a semiconductor component according to an embodiment of the invention. A step 610 of method 600 is to provide a semiconductor substrate having a first conductivity type. As an example, the semiconductor substrate of step 610 can be similar to semiconductor substrate 110 of FIG. 1, semiconductor substrate 210 of FIG. 2, semiconductor substrate 310 of FIG. 3, semiconductor substrate 410 of FIG. 4, and semiconductor substrate 510 of FIG. 5.

A step 620 of method 600 is to provide a semiconductor epitaxial layer having the first conductivity type above the semiconductor substrate. As an example, the semiconductor epitaxial layer can be similar to semiconductor epitaxial layer 111 in FIG. 1, semiconductor epitaxial layer 211 in FIG. 2, semiconductor epitaxial layer 311 in FIG. 3, semiconductor epitaxial layer 411 in FIG. 4, and semiconductor epitaxial layer 511 in FIG. 5.

A step 630 of method 600 is to form at least one electrically-floating semiconductor region having a second conductivity type in the semiconductor epitaxial layer and also, optionally, in the semiconductor substrate. As an example, the electrically-floating semiconductor region can be similar to electrically-floating semiconductor region 115 in FIG. 1, electrically-floating semiconductor region 215 in FIG. 2, electrically-floating semiconductor regions 315 in FIG. 3, a portion of electrically-floating semiconductor regions 415 in FIG. 4, and electrically-floating semiconductor region 515 of FIG. 5. Additional steps can be performed to form additional electrically-floating semiconductor regions, such as the remaining portions of semiconductor regions 415 in FIG. 4 and electrically-floating semiconductor region 545 of FIG. 5.

A step 640 of method 600 is to form a first semiconductor region having the second conductivity type in the semiconductor epitaxial layer to define a second semiconductor region having the first conductivity type in the semiconductor epitaxial layer and located between the first semiconductor region and the electrically-floating semiconductor region. A portion of the second semiconductor region has a thickness. As an example, the first semiconductor region can be similar to semiconductor region 140 of FIG. 1, semiconductor region 240 of FIG. 2, semiconductor region 340 of FIG. 3, semiconductor region 440 of FIG. 4, and semiconductor region 540 of FIG. 5. As a further example, the second semiconductor region can be similar to semiconductor region 120 of FIG. 1, semiconductor region 220 of FIG. 2, semiconductor region 320 of FIG. 3, semiconductor region 420 of FIG. 4, and semiconductor region 520 of FIG. 5. Additional steps can be performed to form portions within the second semiconductor regions, where such portions can be similar to second portion 222 of FIG. 2, second portion 322 of FIG. 3, and portions 522 and 523 of FIG. 5.

A step 650 of method 600 is to form a third semiconductor region having the first conductivity type above the second semiconductor region. As an example, the third semiconductor region can be similar to semiconductor region 130 of FIG. 1 and semiconductor region 230 of FIG. 2.

A step 660 of method 600 is to form a source region having the second conductivity type above the third semiconductor region and a drain region having the second conductivity type above the first semiconductor region. As an example, the source region can be similar to source region 150 of FIG. 1 and source region 250 of FIG. 2. As a further example, the drain region can be similar to drain region 170 of FIG. 1 and drain region 270 of FIG. 2.

A step 670 of method 600 is to form a body contact region having the first conductivity type above the third semiconductor region. As an example, the body contact region can be similar to body contact region 190 of FIG. 1 and body contact region 290 of FIG. 2.

A step 680 of method 600 is to form an oxide region above the first semiconductor region. As an example, the oxide region can be similar to oxide region 180 in FIG. 1 and oxide region 280 in FIG. 2.

A step 690 of method 600 is to form a gate electrode above at least a portion of the first semiconductor region, at least a portion of the third semiconductor region, and at least a portion of the oxide region. As an example, the gate electrode can be similar to gate electrode 160 of FIG. 1 and gate electrode 260 of FIG. 2.

In one embodiment of method 600, step 640 further comprises defining the second semiconductor region with a thickness less than a reverse bias breakdown voltage depletion width in the second semiconductor region.

In the same or another embodiment of method 600, step 640 further comprises defining a first portion of the second semiconductor region under the third semiconductor region. The aforementioned additional steps to step 640 can further comprise forming a second portion of the second semiconductor region under the first semiconductor region, and can still further comprise providing a doping concentration of the second portion of the second semiconductor region greater than a doping concentration of the first portion of the second semiconductor region.

In the same or another embodiment of method 600, step 630 further comprises forming the electrically-floating semiconductor region comprising a continuous layer of semiconductor material under all of an active area of the semiconductor component. The active area comprises portions of the first semiconductor region and the third semiconductor region.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor component discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor component comprising:
    a RESURF transistor comprising:
        a first semiconductor region having a first conductivity type;
        a first electrically-floating semiconductor region having a second conductivity type and located above the first semiconductor region;
        a second semiconductor region having the first conductivity type and located above the first electrically-floating semiconductor region;
        a third semiconductor region having the first conductivity type and located above the second semiconductor region; and
        a fourth semiconductor region having the second conductivity type and located above the second semiconductor region,
    wherein:
        the fourth semiconductor region and the first electrically-floating semiconductor region deplete the second semiconductor region when a reverse bias is applied between the third semiconductor region and the fourth semiconductor region.

2. The semiconductor component of claim 1 wherein:
    portions of the third and fourth semiconductor regions form an active area for the RESURF transistor; and
    the first electrically-floating semiconductor region is continuous under all of the active area.

3. The semiconductor component of claim 1 wherein:
    the second semiconductor region has a first portion and a second portion;
    at least a substantial part of the first portion is under the third semiconductor region;
    at least a substantial part of the second portion is under the fourth semiconductor region; and
    a doping concentration of the first portion is less than a doping concentration of the second portion.

4. The semiconductor component of claim 1 further comprising:
    a junction between the second semiconductor region and the first electrically-floating semiconductor region,
    wherein:
        the second semiconductor region has a thickness;
        the junction has a reverse bias breakdown depletion width in the second semiconductor region; and
        the thickness is less than the reverse bias breakdown depletion width.

5. The semiconductor component of claim 1 wherein:
    the RESURF transistor further comprises:
        a group of electrically-floating semiconductor regions, including the first electrically-floating semiconductor region; and
    each one of the group of electrically-floating semiconductor regions is electrically isolated from each other one of the group of electrically-floating semiconductor regions.

6. The semiconductor component of claim 5 wherein:
    a first one of the group of electrically-floating semiconductor regions is located above a second one of the group of electrically-floating semiconductor regions.

7. The semiconductor component of claim 1 wherein:
    the first electrically-floating semiconductor region is electrically coupled to the fourth semiconductor region after a portion of the second semiconductor region located between the fourth semiconductor region and the first electrically-floating semiconductor region is fully depleted.

8. The semiconductor component of claim 7 wherein:
    a thickness of the portion of the second semiconductor region is less than a depletion width of the portion of the second semiconductor region at an onset of breakdown between the fourth semiconductor region and the portion of the second semiconductor region.

9. The semiconductor component of claim 7 wherein:
    after the portion of the second semiconductor region is fully depleted, a potential of the first electrically-floating semiconductor region is offset from the potential of the fourth semiconductor region by an offset potential.

10. The semiconductor component of claim 9 wherein:
    a reverse-bias breakdown potential between the third semiconductor region and the fourth semiconductor region is a sum of:
        a breakdown potential between the second semiconductor region and the first electrically-floating semiconductor region; and
        the offset potential.

11. A semiconductor component comprising:
    a RESURF transistor comprising:
        a semiconductor substrate having a surface;
        a semiconductor epitaxial layer above the surface of the semiconductor substrate;
        a first N-type electrically-floating semiconductor region in the semiconductor epitaxial layer; and
        a P-type semiconductor region in the semiconductor epitaxial layer and above the first N-type electrically-floating semiconductor region, wherein:
the P-type semiconductor region is configured to be depleted when a reverse bias is applied across the RESURF transistor.

12. The semiconductor component of claim 11 further comprising:
a junction between the P-type semiconductor region and the first N-type electrically-floating semiconductor region;
a P-type body region above the P-type semiconductor region;
an N-type drift region above the P-type semiconductor region;
an N-type drain region above the N-type drift region;
an N-type source region above the P-type body region;
an oxide region above the N-type drift region; and
a gate electrode above at least a portion of:
the N-type drift region;
the P-type body region; and
the oxide region,
wherein:
the first N-type electrically-floating semiconductor region and the N-type drift region deplete the P-type semiconductor region when a reverse bias is applied across the N-type drain region and the P-type body region.

13. The semiconductor component of claim 12 wherein:
the P-type semiconductor region has a thickness;
the junction has a reverse bias breakdown depletion width in the P-type semiconductor region; and
the thickness is less than the reverse bias breakdown depletion width.

14. The semiconductor component of claim 12 wherein:
portions of the P-type body region and the N-type drift region form an active area for the RESURF transistor; and
the first N-type electrically-floating semiconductor region is continuous under all of the active area of the RESURF transistor.

15. The semiconductor component of claim 12 wherein:
the P-type semiconductor region has a first portion and a second portion;
at least a substantial part of the first portion is under the P-type body region;
at least a substantial part of the second portion is under the N-type drift region; and
a doping concentration of the first portion is less than a doping concentration of the second portion.

16. The semiconductor component of claim 12 wherein:
the RESURF transistor further comprises:
a group of N-type electrically-floating semiconductor regions, including the first N-type electrically-floating semiconductor region; and
each one of the group of N-type electrically-floating semiconductor regions is electrically isolated from each other one of the N-type electrically-floating semiconductor regions.

17. The semiconductor component of claim 16 wherein:
a first one of the group of N-type electrically-floating semiconductor regions is located above a second one of the group of N-type electrically-floating semiconductor regions.

18. The semiconductor component of claim 16 wherein:
a first one of the group of electrically-floating semiconductor regions is located side by side with a second one of the group of electrically-floating semiconductor regions in a plane parallel to the surface of the semiconductor substrate.

19. The semiconductor component of claim 12 wherein:
the first N-type electrically-floating semiconductor region is electrically coupled to the N-type drift region after a portion of the P-type semiconductor region located between the N-type drift region and the first N-type electrically-floating semiconductor region is fully depleted.

20. The semiconductor component of claim 19 wherein:
a thickness of the portion of the P-type semiconductor region is less than a depletion width of the portion of the P-type semiconductor region at an onset of breakdown between the N-type drift region and the portion of the P-type semiconductor region.

21. The semiconductor component of claim 19 wherein:
after the portion of the P-type semiconductor region is fully depleted, a potential of the first N-type electrically-floating semiconductor region is offset from the potential of the N-type drift region by an offset potential.

22. The semiconductor component of claim 21 wherein:
a reverse-bias breakdown potential between the P-type semiconductor region and the N-type drift region is a sum of a breakdown potential between the P-type semiconductor region and the first N-type electrically-floating semiconductor region and the offset potential.

* * * * *